(12) United States Patent
Bindseil et al.

(10) Patent No.: US 11,378,635 B2
(45) Date of Patent: Jul. 5, 2022

(54) SYSTEM AND METHOD FOR OPTIMIZING DISCRETE WIRE POSITIONS USED IN GRADIENT COIL ELECTROMAGNETIC DESIGN

(71) Applicant: Synaptive Medical Inc., Toronto (CA)

(72) Inventors: Geron André Bindseil, London (CA); Chad Tyler Harris, Toronto (CA); Ian Robert Oliphant Connell, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 16 days.

(21) Appl. No.: 16/991,967

(22) Filed: Aug. 12, 2020

(65) Prior Publication Data

US 2021/0231758 A1 Jul. 29, 2021

Related U.S. Application Data

(60) Provisional application No. 62/885,626, filed on Aug. 12, 2019.

(51) Int. Cl.
*G01R 33/385* (2006.01)

(52) U.S. Cl.
CPC .............................. *G01R 33/3858* (2013.01)

(58) Field of Classification Search
CPC ............ G01R 33/3858; G01R 33/3802; G01R 33/3875
See application file for complete search history.

(56) References Cited

U.S. PATENT DOCUMENTS

| 2002/0057087 | A1 | 5/2002 | Crozier et al. |
| 2009/0024966 | A1 | 1/2009 | Shvartsman |
| 2012/0032679 | A1 | 2/2012 | Brereton et al. |
| 2016/0178718 | A1* | 6/2016 | Bindseil ............... G01R 33/385 324/322 |
| 2021/0048494 | A1* | 2/2021 | Bindseil ................. G06F 30/10 |

FOREIGN PATENT DOCUMENTS

WO 2016090453 6/2016

OTHER PUBLICATIONS

Handler et al., New Head Gradient Coil Design and Construction Techniques, Journal of Magnetic Resonance Imaging 39:1088-1095. (Year: 2014).*
Search report issued by the Intellectual Property Office of the UK in relation to GB Application No. GB2012586.0 dated Apr. 21, 2021, 2 pgs.
Biomedical Physics & Engineering Express, vol. 4, 2018, While Peter T et al., "Insertable biplanar gradient coils for magnetic resonance microscopy: theoretical minimization of power dissipation for different fabrication methods", p. 035019 figures 2, 3, 4, abstract, section "2. Design method".
Proceedings of The International Society for Magnetic Resonance in Medicine, 2018, Justin Peterson et al., "Development of a Gradient and Shim Insert System for Marmoset Imaging at 9.4 T".

* cited by examiner

*Primary Examiner* — Susan S Lee

(57) ABSTRACT

The present disclosure reports on a method to first determine the required electromagnetic stream function, and then iterate on the contouring of the stream function to optimize the force, torque, shielding, and/or mutual inductance of the design after-the-fact without compromising the electromagnetic performance and an electromagnetic coil manufacture according to the method. These parameters are sensitive to the precise positioning of the discrete wires.

19 Claims, 4 Drawing Sheets

SYSTEM AND METHOD FOR OPTIMIZING DISCRETE WIRE POSITIONS USED IN GRADIENT COIL ELECTROMAGNETIC DESIGN

CROSS-REFERENCE TO RELATED APPLICATION

The This application claims priority from U.S. provisional patent application No. 62/885,626, filed Aug. 12, 2019, the contents of which is incorporated herein by reference.

TECHNICAL FIELD

The field of the invention is systems and methods for magnetic resonance imaging ("MRI"). More particularly, the invention relates to systems and methods for MRI coil design.

BACKGROUND

Gradient coils produce orthogonal magnetic fields that impress spatially-encoded information upon the received signal during an MRI acquisition. In general, a gradient coil is a series of complex electrical conductor paths that, when driven by an external current-source, produce corresponding magnetic fields in space.

The spatial distribution of these magnetic fields is well-known and can be described analytically as a three-dimensional point cloud of magnetic field intensities. To achieve the desired magnetic field distribution, as described by the three-dimensional point cloud, the electric current density required to replicate the ideal field can be generally represented by an idealized 'stream function' across the surface of a gradient coil according to established methods of finite element electromagnet design.

The stream function representation of the gradient coil design is the direct result of the design algorithm, and then in a subsequent step, the stream function is contoured to achieve the positions of a discrete set of windings that approximate the ideal current distribution. Through the discretization of the stream function into individual current paths, a best-fit conductor path is found that defines the electromagnetic design of a gradient coil axes. The discretization of an ideal stream function into a set number of conducting paths is not readily described analytically and requires either exhaustive user input or guided iteration to achieve the best coil performance.

Additionally, it is quite common in gradient coil design to have the ideal stream function satisfy performance requirements of, for example, force, torque and shielding, but the discretized wire pattern representations are poorly force and torque balanced (contributing to noise and destructive movement of the gradient coil during operation) or have unsatisfactory shielding (contributing to increased eddy currents which can result in imaging artifacts).

The present disclosure provides a method to first calculate the required electromagnetic stream function, and then iterate on the contouring of the stream function to optimize the force, torque and shielding of the design after-the-fact and other relevant performance metrics, to arrive at the positioning of the discrete wires without compromising the electromagnetic performance. These parameters are sensitive to the precise positioning of the discrete wires.

SUMMARY

Embodiments described herein relate to a method to calculate the required electromagnetic stream function, and then iterate on the contouring of the stream function to optimize the force, torque and shielding and other relevant performance metrics of the design after-the-fact without compromising the electromagnetic performance. These parameters are sensitive to the precise positioning of the discrete wires.

A method of manufacturing an electromagnet coil for use in a magnetic resonance imaging (MRI) system is provided, comprising forming a coil representation of a coil surface for the electromagnet coil, setting a plurality of performance metric requirements for a plurality of corresponding performance metrics for the electromagnet coil, defining a performance functional based on the performance metrics and a discretized coil representation, optimizing the performance functional based on the plurality of performance metric requirements by varying a contour spacing and contour offset of the discretized coil representation, generating an updated discretized coil representation over the coil surface based on the optimized performance functional, and obtaining coil windings from the updated discretized coil representation.

In a further embodiment, an electromagnetic coil of an MRI system is provided, the electromagnetic coil comprising a wire pattern based on a discretized coil representation over a coil surface, wherein the performance of the discretized coil representation is optimized by optimizing a spacing between contour lines and optimizing an offset of the contour lines of a coil representation based on a stream function or current density.

DETAILED DESCRIPTION

Figure 1:
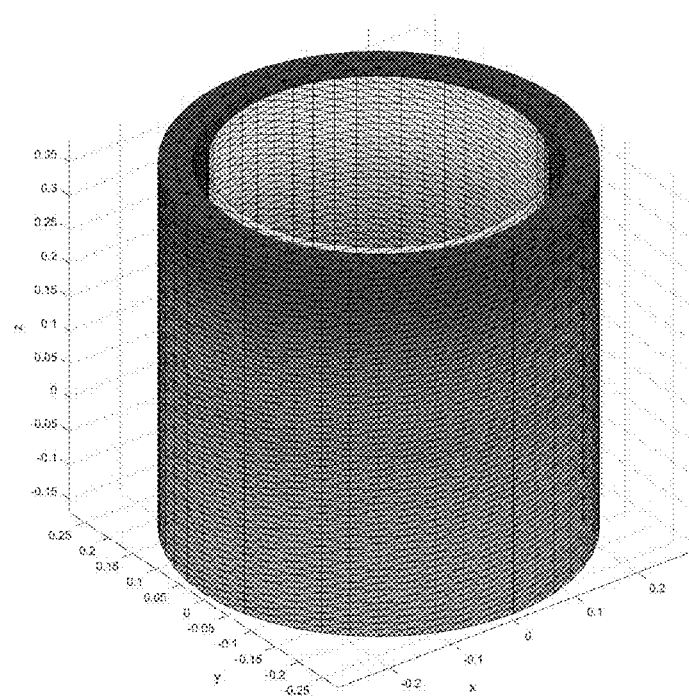
FIG. 1 is a diagram illustrating a sample stream function computed across a gradient coil surface.

This disclosure provides a method for manufacturing an electromagnetic coil. The method includes an iterative algorithm that adds several degrees of freedom to the problem of discretizing an ideal stream function for force and torque balancing and shielding for any given electromagnetic design. Initially, the stream function is obtained and forms a continuous representation of an electromagnetic coil, from which it is possible to calculate a continuous current density pattern (FIG. 1). The change in darkness from top to bottom represents the variation of the stream function across the surface. A first pass stream function discretization is then performed that balances mechanical requirements (wire-to-wire separation) with electromagnetic requirements (field linearity, coil efficiency, etc.).

Figure 2:
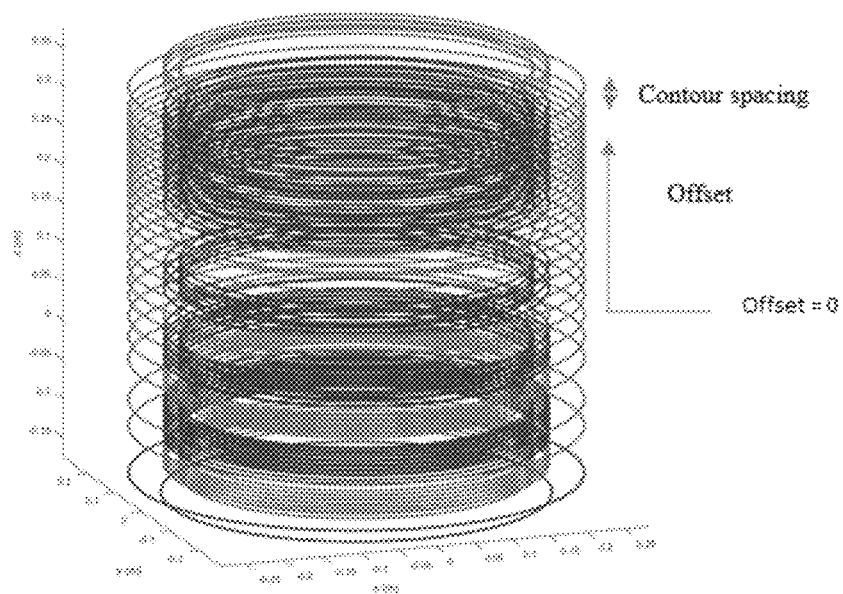
FIG. 2 is a diagram illustrating a sample wire discretization computed from a gradient coil stream function. Additional degrees-of-freedom 'Offset' and 'Contour spacing' are included.

Referring to FIG. 2, a conductor arrangement arrived at via the first-pass discretization is shown based on a contouring of the stream function. In this discretized coil representation, the contour spacing of the stream function, which governs how many wires are used to represent the electromagnetic coil, may be selected to achieve the desired coil efficiency; however, there are two additional degrees of freedom in the selection of wire location to represent a given stream function coil representation: the contour spacing (relating to the relative distance scaling of the conducting paths) and the contour offset (relating to the relative location of the starting point for forming contours). The conductor arrangement provides a modest compromise of the performance goals to balance mechanical requirements (wire-to-wire separation) with electromagnetic requirements (field linearity, coil efficiency, etc.). However, by inserting two additional degrees of freedom, contour spacing and contour offset, it is possible to further increase the gradient coil performance. This improvement comes from a better discretization of the stream function into wire positions and has an impact on performance metrics that may be sensitive to the particular placement of wires given a certain stream function coil representation, such as torque balancing, force balancing, shielding, or mutual inductance minimization with other coils. Therefore, the first-pass conductor arrangement is provided as a possible starting point into a secondary optimization algorithm that iterates across the relative scaling of the distance between conducting paths (contour spacing) and their starting point (contour offset; Arrows in FIG. 2 denoting positional values for this optimization procedure). For a Z gradient coil or any other electromagnet coil having rotational symmetry about an axis, the contour offset can be seen as a relative offset of the starting Z contour line; however, this is not the case for a general electromagnetic coil.

The algorithm utilizes an optimization method, such as an intelligent parametric sweep, a gradient descent-based optimization, or a simulated annealing method, and is written such that, in comparison to the first-pass discretization, discretized coil representations demonstrating better performance metrics such as force and torque balancing, shielding, or mutual inductance minimization with other coils, may be generated without sacrificing the original electromagnetic performance of the coil such as are important to MR imaging.

Figure 3:
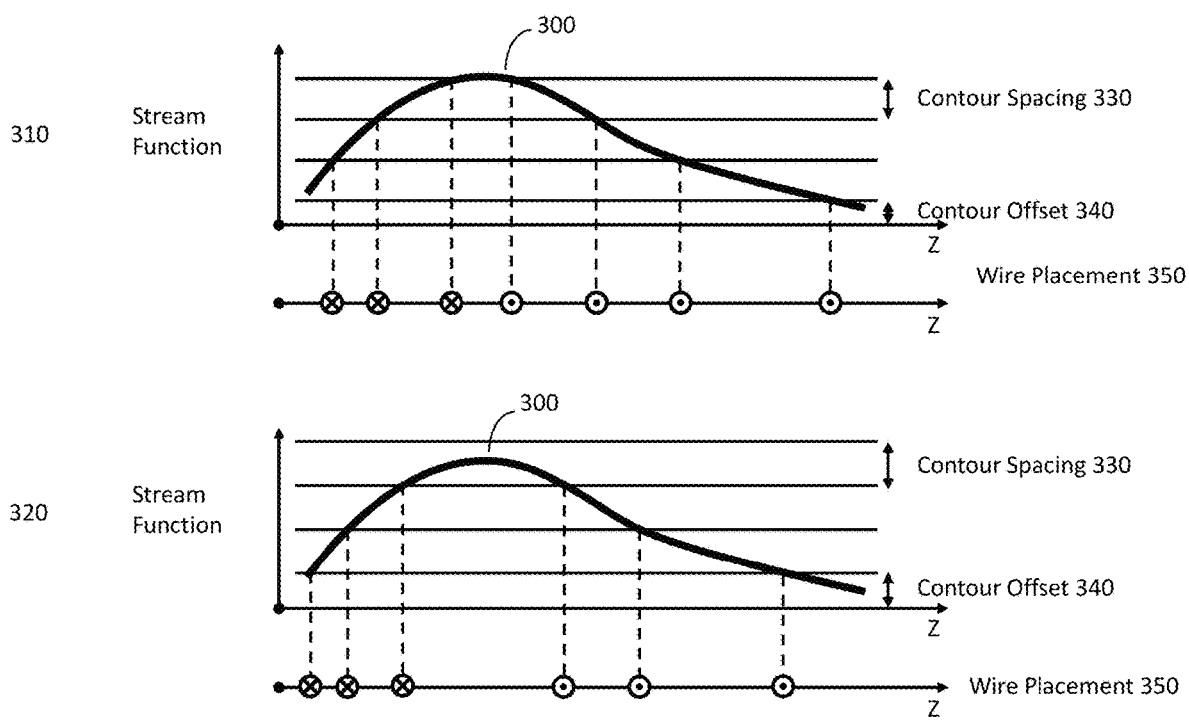
FIG. 3 is a diagram illustrating a one-dimensional view of a wire placement from a stream function such as shown in FIG. 1, showing two different one-dimensional discretized coil representations for different contour spacing and contour offset.

Referring to FIG. 3, contouring of a stream function into discrete conductor paths with varying contour spacing and contour offset is further illustrated graphically for a one-dimensional stream function 300 that varies along direction Z. The upper and lower graphs 310, 320 show the same stream function 300 that is contoured in two different ways. Comparing the top and bottom graphs 310, 320, the contour spacing 330 and the contour offset 340 are different between the two graphs, resulting in different positions for the wires 350. The wire locations 350 below each stream function graph have a cross to represent current going into the page and a dot to represent current coming out of the page (direction). This example is provided for a one-dimensional stream function that varies along direction Z, whereas the concept of the present disclosure is for a stream function to be a scalar function over a three dimensional surface; however, the concept for contour spacing and contour offset to position wires of the coil remains the same.

From academic literature, the boundary element method (BEM) is the 'gold standard' method for determining gradient coil wire patterns. Several methods for computing a stream function across a discretized surface from inverting the magnetic vector potential exist and discretization of the stream function with the intent of force and torque balancing is typically included as an additional objective function term in conjunction with linearity, efficiency, shielding, etc. The force and torque balancing of a gradient coil is included in the initial formation of the objective function that includes terms penalizing deviations away from the ideal gradient field shape; however, the particular way in which the stream function is contoured into wire positions may itself result in worse performance for metrics such as force and torque balancing, shielding, or other performance metrics. This is not representative of our method for piece-wise optimization.

The use of a two-step approach with (1) discretizing the stream function for efficiency, then (2) improving the resulting force and torque balancing, shielding, or mutual inductance performance of the actual wire positions after-the-fact through the insertion of additional degrees of freedom into the discretization problem is not, at present, a widely known or published method for force and torque balancing gradient coil axes, or improving shielding. Thus, force and torque balancing, as well as shielding is included in the first optimization to obtain a stream function, but once the stream function is contoured, force and torque may not be balanced because force and torque, as well as shielding and mutual inductance are highly sensitive to the way the stream function is contoured. Therefore, the contour spacing and contour offset may be adjusted until, for example, the force and torque are again balanced or the shielding performance is restored.

Further, this disclosure is applicable to all gradient coil axes: x, y and z, as well as other electromagnets such as shim coils. Additionally, mutual inductance between gradient coils and shim coils can be optimized (minimized) utilizing this method, if such a mutual inductance constraint or weighted parameter is included in the original design of the stream function.

Figure 4:
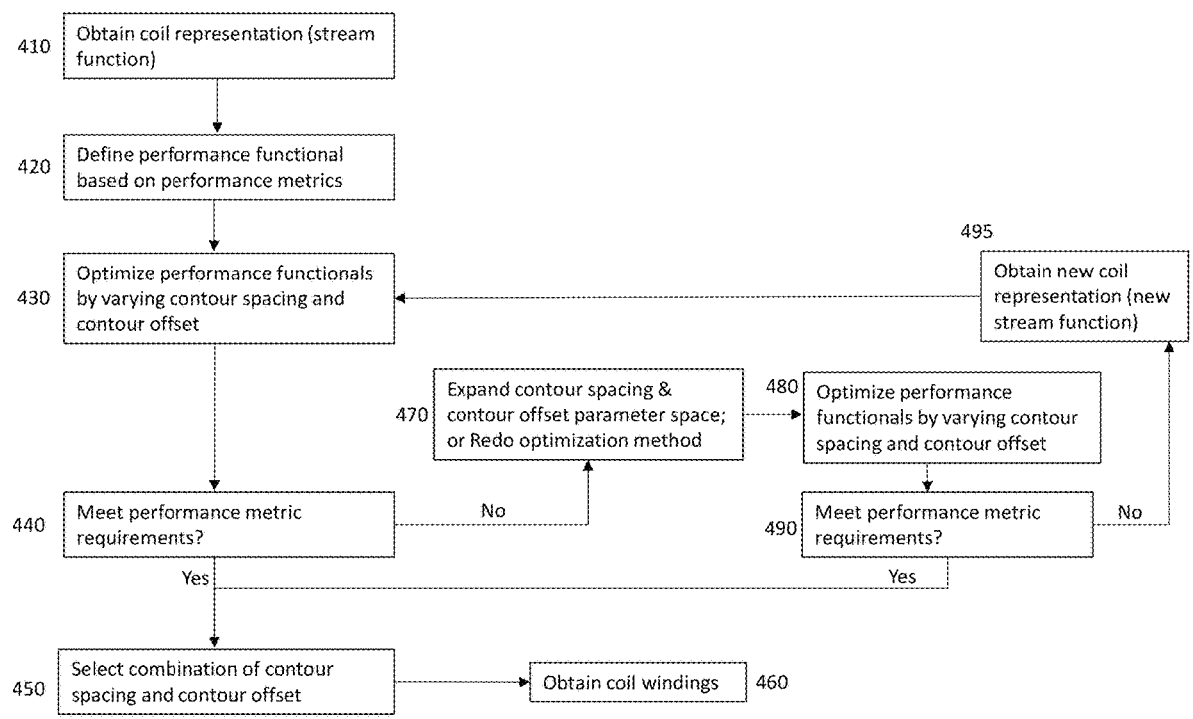
FIG. 4 is a flow chart illustrating a system and method for positioning of wires of a coil in an MRI.

Referring to FIG. 4, the steps of a method for manufacturing an electromagnet coil are illustrated. Initially a coil representation 410 of a coil surface for the electromagnet coil is obtained. The coil representation is a result of a design algorithm that includes an optimization of performance functionals that may include field targets, efficiency, shielding, torque & force balancing, mutual inductance minimization with other coils, etc. An example of a coil representation is illustrated in FIG. 1 showing a sample stream function computed across a z-axis gradient coil surface. The stream function representation 410 is continuous, like a current density distribution.

The stream function contains an ideal representation of the coil with optimal performance metrics. Placement of the coil wires is determined by contouring the stream function into discretized wires, with the goal of maintaining all of the original performance metrics in the discretized coil representation.

At step 420, a performance functional is defined based on the performance metrics. The performance metrics are calculated for the discretized coil representation rather than the stream function coil representation, i.e. given the particular wire locations, what is the net torque (or for example force, shielding, or mutual inductance with other coils). The performance functional may combine different performance metrics or multiple performance functionals could be analyzed simultaneously.

The performance functional is then optimized 430. During the optimization, the contour spacing and/or the contour offset may be changed while keeping the stream function the same. Every time at least one of the contour spacing or contour offset is changed, the performance functional is recalculated. The result of the recalculation can be stored or the result can be used to determine whether the optimization should be completed or what combination of contour spacing and contour offset should be tested next.

This step 430 can incorporate any optimization or search function, such as gradient descent, simulated annealing, parameter grid search (looping over a set of all combinations of a sampling of the parameter space). Whatever is included, the optimization 430 will look at combinations of contour spacing and contour offset for a given stream function until a combination of contour spacing and contour offset is found that results in a discretized coil representation that meets the performance metric requirements. The performance functional(s) are calculated for the coil each time the contour spacing and/or contour offset are adjusted. The performance metrics/functional(s) can be constrained (within a range or zero) or be target minimized quantities or be quantities as close as possible to a certain criterion.

Steps 430 and 440 may be iterated until the performance metric requirements are met.

If the performance metric requirements 440 are met, then that combination of contour spacing and contour offset is selected 450 and used to obtain the coil windings 460 for the manufacture of an electromagnet coil for an MRI system.

If the performance metric requirements 440 are not met, then the contour spacing and contour offset parameter space may be expanded in the optimization space (if a grid search) or the optimization may be repeated in a different way (for example with new initial conditions in some methods, such as gradient descent, to ensure the conditions have not introduced a local minimum) 470. The performance functional is then optimized again 480.

If the performance metric requirements 490 are then met, then that combination of contour spacing and contour offset is selected 450 and used to obtain the coil windings 460 for the manufacture of an electromagnet coil for an MRI system. If the performance metric requirements 490 are still not met, then a different stream function may be obtained 495. The performance functionals would then be optimized again 430 until the performance metric requirements are met 440, and the combination of contour spacing and contour offset is selected 450 to obtain the coil windings 460.

The performance metrics may include a spacing between contour lines of the discretized coil representation and optimizing the performance functional would be done by adjusting the spacing between the contour lines, as illustrated in FIG. 2. Where the coil representation is a stream function, the contour lines are the wire paths of the discretized electromagnet coil. Where the coil representation is based on a current density, adjusting the spacing may be done by scaling the spacing of flux lines of the current density.

In another embodiment, the performance metrics may include an offset of contour lines of the discretized coil representation and optimizing the performance functional is done by adjusting the offset of the contour lines, as illustrated in FIG. 2. In the case where the coil representation is based on a stream function, the plurality of performance metrics may include an offset of contour lines of the first discretized coil representation and optimizing the performance functional is done by adjusting the offset of the contour lines, which may be equivalently achieved by adding a constant offset to the stream function.

The performance metrics may include a net force metric, a net torque metric, a field linearity metric, a dissipative power metric, an energy metric, a shielding metric, or any other metric.

The performance requirements may include mechanical performance requirements, for example wire-to-wire separation, and electromagnetic performance requirements, for example field linearity and coil efficiency, and optimizing the performance functional based on the plurality of performance metric requirements includes balancing the mechanical performance requirements and the electromagnetic performance requirements to generate a coil representation. The coil representation may be a current density pattern based on a stream function.

In further embodiments, optimizing the performance functional may include implementing one of a parametric sweep or a gradient descent-based optimization. Optimizing the performance functional may also include selecting contour lines with improved performance. The improved performance may include improved force balancing and/or improved torque balancing and/or improved shielding performance.

In a further embodiment, the plurality of performance metrics may include a magnetic field-shape metric. The magnetic field-shape metric may include a target magnetic field metric, and optimizing the performance functional includes optimizing (minimizing) a difference between the target magnetic field and a predicted magnetic field generated based on the first performance functional.

In a further embodiment, optimizing the performance functional includes selecting contour lines that result in discretized coil representations with minimal mutual inductance with other coils in the MRI system.

In further embodiments, the coil representation may be based on a boundary element method, the coil surface may be cylindrical, and the electromagnetic coil may be one of a gradient coil, a shim coil, or a main magnet.

In further embodiments, the coil representation may be a current density representation, not a stream function, and optimization of the contour spacing and contour offset may be performed in a similar manner as described here by adapting the optimization method to the problem of contouring a current density, which generally involves forming lines of current flux.

An electromagnetic coil for an MRI system manufactured according to the method above may include a wire pattern based on a discretized stream function over a coil surface that is optimized in at least two ways: by spacing between contour lines and offsetting the contour lines.

What is claimed is:

1. A method of manufacturing an electromagnet coil for use in a magnetic resonance imaging (MRI) system, the steps of the method comprising:
   forming a coil representation of a coil surface for the electromagnet coil;
   setting a plurality of performance metric requirements for a plurality of corresponding performance metrics for the electromagnet coil;
   defining a performance functional based on the performance metrics and a discretized coil representation;
   optimizing the performance functional based on the plurality of performance metric requirements, by varying a contour spacing and contour offset of the discretized coil representation;
   generating an updated discretized coil representation over the coil surface based on the optimized performance functional; and
   obtaining coil windings from the updated discretized coil representation.

2. The method as recited in claim 1, wherein the plurality of performance metrics includes a spacing between contour lines of the discretized coil representation and optimizing the performance functional comprises adjusting the spacing between contour lines of the discretized coil representation.

3. The method as recited in claim 2, wherein the coil representation is based on a current density and adjusting the spacing between the contour lines comprises scaling the spacing of flux lines of the current density.

4. The method as recited in claim 1, wherein the plurality of performance metrics includes an offset of contour lines of the discretized coil representation and optimizing the performance functional comprises adjusting the offset of the contour lines.

5. The method as recited in claim 4, wherein the coil representation is based on a stream function and adjusting the offset of the contour lines includes adding a constant offset to the stream function.

6. The method as recited in claim 1, wherein the coil representation is based on a stream function, and wherein adjusting the contour lines comprises adjusting at least one of a spacing between the contour lines or an offset of the contour lines.

7. The method as recited in claim 1, wherein the plurality of performance metrics includes at least one of a net force metric, a net torque metric, a field linearity metric, a dissipative power metric, and an energy metric.

8. The method as recited in claim 1, wherein the plurality of performance metric requirements comprises mechanical performance requirements and electromagnetic performance requirements, and wherein optimizing the performance functional based on the plurality of performance metric requirements comprises balancing the mechanical performance requirements and the electromagnetic performance requirements.

9. The method as recited in claim 8, wherein the mechanical performance requirements include wire-to-wire separation.

10. The method as recited in claim 8, wherein the electromagnetic performance requirements include at least one of field linearity and coil efficiency.

11. The method as recited in claim 1, wherein optimizing the performance functional includes implementing one of a parametric sweep or a gradient descent-based optimization or simulated annealing-based optimization.

12. The method as recited in claim 1, wherein optimizing the performance functional comprises selecting the contour lines of the discretized coil representation with optimized performance metrics.

13. The method as recited in claim 12, wherein the optimized performance metrics includes at least one of optimized force balancing and optimized torque balancing.

14. The method as recited in claim 1, wherein the plurality of performance metrics includes a magnetic field-shape metric.

15. The method as recited in claim 14, wherein the magnetic field-shape metric comprises a target magnetic field, and wherein optimizing the performance functional further comprises optimizing a difference between the target magnetic field and a predicted magnetic field generated based on the performance functional.

16. The method as recited in claim 1, wherein optimizing the performance functional comprises selecting contour lines of the discretized coil representation with minimal induction on other coils in the MRI system.

17. The method as recited in claim 1, wherein the coil representation is based on a boundary element method.

18. The method as recited in claim 1, wherein the coil surface is cylindrical.

19. The method as recited in claim 1, wherein the electromagnetic coil is one of a gradient coil, a shim coil, or a main magnet.

* * * * *